(12) United States Patent
Tsou et al.

(10) Patent No.: US 12,046,686 B2
(45) Date of Patent: Jul. 23, 2024

(54) OPTICAL FILTER STRUCTURE FOR ARBITRARY COMBINATION OF RGB AND IR WAVELENGTH RANGES AND ITS MANUFACTURING METHOD

(71) Applicant: KingRay Technology Co., LTD., Zhudong Township (TW)

(72) Inventors: Cheng-Hsing Tsou, Zhudong Township (TW); Wei-Hao Cheng, Zhudong Township (TW); Pei-Yuan Ni, Zhudong Township (TW)

( * ) Notice: Subject to any disclaimer, the term of this patent is extended or adjusted under 35 U.S.C. 154(b) by 0 days.

(21) Appl. No.: 17/524,129

(22) Filed: Nov. 11, 2021

(65) Prior Publication Data
US 2022/0149212 A1 May 12, 2022

(30) Foreign Application Priority Data

Nov. 12, 2020 (TW) .................................. 109135980

(51) Int. Cl.
*H01L 31/0216* (2014.01)
*C23C 14/00* (2006.01)
*G02B 5/20* (2006.01)

(52) U.S. Cl.
CPC ...... *H01L 31/0216* (2013.01); *C23C 14/0036* (2013.01); *G02B 5/208* (2013.01)

(58) Field of Classification Search
CPC ......... H01L 27/14685; H01L 27/14621; H01L 31/0216; G02B 5/281; G02B 5/283; G02B 1/10; G02B 5/285; G02B 5/208; C23C 14/0036
See application file for complete search history.

(56) References Cited

U.S. PATENT DOCUMENTS

| | | | |
|---|---|---|---|
| 2002/0021479 A1* | 2/2002 | Scalora | H01L 51/5036 359/254 |
| 2005/0237448 A1 | 10/2005 | Wu et al. | |
| 2012/0205685 A1 | 8/2012 | Seo et al. | |
| 2015/0369980 A1* | 12/2015 | Ockenfuss | H01L 27/14685 359/359 |
| 2017/0145498 A1* | 5/2017 | Saxena | G02B 3/0006 |
| 2018/0277584 A1 | 9/2018 | Maruyama | |
| 2020/0057183 A1* | 2/2020 | Mu | G02B 5/288 |
| 2020/0393757 A1 | 12/2020 | Shimada et al. | |
| 2021/0297638 A1 | 9/2021 | Sugiyama | |

FOREIGN PATENT DOCUMENTS

| | | |
|---|---|---|
| CN | 108028260 A | 5/2018 |
| TW | 267662 B | 12/2006 |
| TW | I647973 B | 1/2019 |
| TW | 201940977 A | 10/2019 |
| TW | 202011057 A | 3/2020 |

* cited by examiner

*Primary Examiner* — Anthony J Frost
(74) *Attorney, Agent, or Firm* — Lerner David LLP (57) ABSTRACT

The present invention discloses an optical bandpass filter structure targeting an arbitrary combination of the spectral ranges of R (red), G (green), B (blue) and IR (infrared) light, which comprises a substrate that is a wafer-based semiconductor sensing element, and a filter layer that is formed on one side of the substrate. The filter layer includes a plurality of basic units organized as a two-dimensional array, in which each of the basic units is composed of a plurality of pixel filter films fabricated by a vacuum coating method.

8 Claims, 6 Drawing Sheets

OPTICAL FILTER STRUCTURE FOR ARBITRARY COMBINATION OF RGB AND IR WAVELENGTH RANGES AND ITS MANUFACTURING METHOD

NOTICE OF COPYRIGHTS AND TRADE DRESS

A portion of the disclosure of this patent document contains material which is subject to copyright or trade dress protection. This patent document may show and/or describe matter that is or may become trade dress of the owner. The copyright and trade dress owner has no objection to the facsimile reproduction by anyone of the patent disclosure, as it appears in the Patent and Trademark Office patent files or records, but otherwise reserves all copyright and trade dress rights whatsoever.

CLAIM OF PRIORITY

This application claims priority to Taiwanese Application No. 109135980, filed Nov. 12, 2020, the contents of which are hereby incorporated by reference in their entirety.

FIELD OF THE EMBODIMENTS

The present invention relates to an optical filter structure and its manufacturing process that is applied to Ambient Light Sensors (ALS), Proximity Sensors (PS), RGB color temperature sensor chips, and gesture sensor chips, etc., and more particularly to an optical filter structure and manufacturing process that can achieve a better filter thickness uniformity (an error within 5 nm) and can target an arbitrary combination of red, green, blue, and infrared spectral ranges according to the given specification.

BACKGROUND

Traditional optical sensors, such as visible light camera modules, require the use of infrared-cut filters to remove the unnecessary near-infrared light so as to prevent false color or ripple that are caused by the presence of infrared light influencing the visible light as captured by the optical sensors. However, the lack of independent red, green, blue and infrared pixels in the traditional visible light camera modules lead to low sensitivity and resolution of the images formed. Thus, color filters for red, green, blue and infrared pixels are needed for the images formed to have higher sensitivity and resolution.

The widely known manufacturing process for color filters, such as the one presented in Taiwan patent application number 100112527, is primarily the inkjet printing process, resulting in a thickness of about 5 um of the color filtering film, relatively wasteful use of photoresist, and lower resolution and positional stability. As the substrate size increases gradually over time, the manufacturing process evolved from spin coating with the photoresist dripping down from a central tube to spin coating with the photoresist applied via slit coating, with the underlying objective being to reduce the usage of photoresist. As the substrate size expands further in the future, the thickness uniformity of the filtering film will fail to stay within the 2% error required by the specification, while the transmittance and wavelength will fail to satisfy the requirement of the specification (the transmittance of the cut-off band below 1%).

To address the aforementioned problems, the inventors designed the present invention through active experimentation effort.

SUMMARY OF THE INVENTION

The present disclosure provides for an optical filter structure for an arbitrary combination of R, G, B, and IR wavelength ranges, including a substrate, and a filter layer formed on one side of the substrate. Preferably, the substrate is a wafer-based semiconductor sensing device. Preferably, the filter layer comprises a plurality of basic units organized as a two-dimensional array. Preferably, each of the basic units comprises a plurality of pixel filter films formed by a vacuum coating method. Preferably, the plurality of pixel filter films comprises an arbitrary combination of an R pixel filter film, a G pixel filter film, a B pixel filter film, and an IR pixel filter film, configured such that each pixel filter present in the basic unit only permits light having a wavelength within its passband to pass through.

In an embodiment, the R pixel filter film is formed by stacking, in alternation, a first plurality of silver (Ag) layers and a first plurality of high-refractive-index material layers with refractive indices higher than that of silver, such that the R pixel filter film has a thickness of 300 nm to 900 nm, the R pixel filter film has a passband with a range of 300 nm to 1100 nm with a central wavelength ranging from 625 nm to 740 nm, the R pixel filter film has a transmittance less than 1% over the cut-off band, and the R pixel filter film has a transmittance greater than 55% over the central wavelength range when the angle of incidence of incoming light is 0°.

In an embodiment, the G pixel filter film is formed by stacking, in alternation, a second plurality of silver (Ag) layers and a second plurality of high-refractive-index material layers with refractive indices higher than that of silver, such that the G pixel filter film has a thickness of 300 nm to 900 nm, the G pixel filter film has a passband with a range of 300 nm to 1100 nm with a central wavelength ranging from 500 nm to 565 nm, the G pixel filter film has a transmittance less than 1% over the cut-off band, and the G pixel filter film has a transmittance greater than 55% over the central wavelength range when the angle of incidence of incoming light is 0°.

In an embodiment, the B pixel filter film is formed by stacking, in alternation, a third plurality of silver (Ag) layers and a third plurality of high-refractive-index material layers with refractive indices higher than that of silver, such that the B pixel filter film has a thickness of 300 nm to 900 nm, the B pixel filter film has a passband with a range of 300 nm to 1100 nm with a central wavelength ranging from 485 nm to 500 nm, the B pixel filter film has a transmittance less than 1% over the cut-off band, and the B pixel filter film has a transmittance greater than 55% over the central wavelength range when the angle of incidence of incoming light is 0°.

In an embodiment, the IR pixel filter film is formed by stacking, in alternation, a fourth plurality of silver (Ag) layers and a fourth plurality of high-refractive-index material layers with refractive indices higher than that of silver, such that the IR pixel filter film has a thickness of 300 nm to 900 nm, the IR pixel filter film has a passband with a range of 300 nm to 1100 nm with a central wavelength at least partially overlapping with the range of 800 nm to 1100 nm, the IR pixel filter film has a transmittance less than 1% over the cut-off band, and the IR pixel filter film has a transmittance greater than 30% over the central wavelength range when the angle of incidence of incoming light is 0°.

In an embodiment, each of the layers within the first, second, third, and fourth plurality of Ag layers has a refractive index of 0.1 to 0.48 together with an extinction coefficient of 5.85 to 14.4 over the wavelength range of 350 nm to 2000 nm, and wherein each of the layers within the first, second, third, and fourth plurality of high-refractive-index material layers has a refractive index of greater than 1.6 together with an extinction coefficient of close to zero over the wavelength range of 350 nm to 1100 nm.

In an embodiment, each of the layers within the first, second, third, and fourth plurality of high-refractive-index material layers is composed of a material selected from the group consisting of trititanium pentoxide (Ti3O5), titanium dioxide (TiO2), niobium pentoxide (Nb2O5), tantalum pentoxide (Ta2O5), lanthanum titanium oxide (La2O7Ti2 or H4), and mixtures thereof.

In an embodiment, the R pixel filter film is formed so that it has the structure shown in one of the following tables:

| Layer No. | Material | Thickness (nm) |
|---|---|---|
| 1 | $Ti_3O_5$ | 127.04 |
| 2 | Ag | 8.19 |
| 3 | $Ti_3O_5$ | 85.41 |
| 4 | Ag | 30.79 |
| 5 | $Ti_3O_5$ | 96.8 |
| 6 | Ag | 39.63 |
| 7 | $Ti_3O_5$ | 96.89 |
| 8 | Ag | 26.69 |
| 9 | $Ti_3O_5$ | 56.23 |

| Layer No. | Material | Thickness (nm) |
|---|---|---|
| 1 | $TiO_2$ | 58.98 |
| 2 | Ag | 19.6 |
| 3 | $TiO_2$ | 94.78 |
| 4 | Ag | 32.64 |
| 5 | $TiO_2$ | 93.18 |
| 6 | Ag | 31.49 |
| 7 | $TiO_2$ | 90.07 |
| 8 | Ag | 23.19 |
| 9 | $TiO_2$ | 47.74 |

| Layer No. | Material | Thickness (nm) |
|---|---|---|
| 1 | $Nb_2O_5$ | 59.51 |
| 2 | Ag | 19.6 |
| 3 | $Nb_2O_5$ | 104.28 |
| 4 | Ag | 32.64 |
| 5 | $Nb_2O_5$ | 94.02 |
| 6 | Ag | 31.49 |
| 7 | $Nb_2O_5$ | 90.88 |
| 8 | Ag | 23.19 |
| 9 | $Nb_2O_5$ | 48.14 |

| Layer No. | Material | Thickness (nm) |
|---|---|---|
| 1 | $Ta_2O_5$ | 63.94 |
| 2 | Ag | 19.6 |
| 3 | $Ta_2O_5$ | 102.74 |
| 4 | Ag | 32.64 |
| 5 | $Ta_2O_5$ | 101.01 |
| 6 | Ag | 31.49 |
| 7 | $Ta_2O_5$ | 97.64 |
| 8 | Ag | 23.19 |
| 9 | $Ta_2O_5$ | 51.72 |

| Layer No. | Material | Thickness (nm) |
|---|---|---|
| 1 | $H_4$ | 64.89 |
| 2 | Ag | 19.6 |
| 3 | $H_4$ | 104.28 |
| 4 | Ag | 32.64 |
| 5 | $H_4$ | 102.52 |
| 6 | Ag | 31.49 |
| 7 | $H_4$ | 99.1 |
| 8 | Ag | 23.19 |
| 9 | $H_4$ | 52.5 |

In an embodiment, the G pixel filter film is formed so that it has the structure shown in one of the following tables:

| Layer No. | Material | Thickness (nm) |
|---|---|---|
| 1 | Ag | 15.13 |
| 2 | $Ti_3O_5$ | 60.13 |
| 3 | Ag | 40.44 |
| 4 | $Ti_3O_5$ | 66.48 |
| 5 | Ag | 41.96 |
| 6 | $Ti_3O_5$ | 71.85 |
| 7 | Ag | 19.18 |
| 8 | $Ti_3O_5$ | 62.52 |

| Layer No. | Material | Thickness (nm) |
|---|---|---|
| 1 | Ag | 15.13 |
| 2 | $TiO_2$ | 60.14 |
| 3 | Ag | 40.44 |
| 4 | $TiO_2$ | 66.49 |
| 5 | Ag | 41.96 |
| 6 | $TiO_2$ | 71.85 |
| 7 | Ag | 19.18 |
| 8 | $TiO_2$ | 62.52 |

| Layer No. | Material | Thickness (nm) |
|---|---|---|
| 1 | Ag | 15.13 |
| 2 | $NB_2O_5$ | 60.95 |
| 3 | Ag | 40.44 |
| 4 | $NB_2O_5$ | 67.39 |
| 5 | Ag | 41.95 |
| 6 | $NB_2O_5$ | 72.82 |
| 7 | Ag | 19.18 |
| 8 | $NB_2O_5$ | 63.37 |

| Layer No. | Material | Thickness (nm) |
|---|---|---|
| 1 | Ag | 15.13 |
| 2 | $Ta_2O_5$ | 65.42 |
| 3 | Ag | 40.44 |
| 4 | $Ta_2O_5$ | 72.33 |
| 5 | Ag | 41.96 |
| 6 | $Ta_2O_5$ | 78.16 |
| 7 | Ag | 19.18 |
| 8 | $Ta_2O_5$ | 68.02 |

| Layer No. | Material | Thickness (nm) |
| --- | --- | --- |
| 1 | Ag | 15.13 |
| 2 | $H_4$ | 66.94 |
| 3 | Ag | 40.44 |
| 4 | $H_4$ | 74.01 |
| 5 | Ag | 41.96 |
| 6 | $H_4$ | 79.98 |
| 7 | Ag | 19.18 |
| 8 | $H_4$ | 69.59 |

In an embodiment, the B pixel filter film is formed so that it has the structure shown in one of the following tables:

| Layer No. | Material | Thickness (nm) |
| --- | --- | --- |
| 1 | $Ti_3O_5$ | 45.96 |
| 2 | Ag | 13.79 |
| 3 | $Ti_3O_5$ | 149.81 |
| 4 | Ag | 35.72 |
| 5 | $Ti_3O_5$ | 51.02 |
| 6 | Ag | 35.93 |
| 7 | $Ti_3O_5$ | 27.34 |

| Layer No. | Material | Thickness (nm) |
| --- | --- | --- |
| 1 | $TiO_5$ | 46.17 |
| 2 | Ag | 13.79 |
| 3 | $TiO_5$ | 150.49 |
| 4 | Ag | 35.72 |
| 5 | $TiO_5$ | 51.25 |
| 6 | Ag | 35.93 |
| 7 | $TiO_5$ | 27.47 |

| Layer No. | Material | Thickness (nm) |
| --- | --- | --- |
| 1 | $Nb_2O_5$ | 46.81 |
| 2 | Ag | 13.79 |
| 3 | $Nb_2O_5$ | 152.6 |
| 4 | Ag | 35.72 |
| 5 | $Nb_2O_5$ | 51.97 |
| 6 | Ag | 35.93 |
| 7 | $Nb_2O_5$ | 27.85 |

| Layer No. | Material | Thickness (nm) |
| --- | --- | --- |
| 1 | $Ta_2O_5$ | 50.78 |
| 2 | Ag | 13.79 |
| 3 | $Ta_2O_5$ | 165.54 |
| 4 | Ag | 35.72 |
| 5 | $Ta_2O_5$ | 56.38 |
| 6 | Ag | 35.93 |
| 7 | $Ta_2O_5$ | 30.22 |

| Layer No. | Material | Thickness (nm) |
| --- | --- | --- |
| 1 | $H_4$ | 52.15 |
| 2 | Ag | 13.79 |
| 3 | $H_4$ | 170 |
| 4 | Ag | 35.72 |
| 5 | $H_4$ | 57.9 |
| 6 | Ag | 35.93 |
| 7 | $H_4$ | 31.03 |

In an embodiment, the IR pixel filter film is formed so that it has the structure shown in one of the following tables:

| Layer No. | Material | Thickness (nm) |
| --- | --- | --- |
| 1 | $Ti_3O_5$ | 82.56 |
| 2 | Ag | 25.75 |
| 3 | $Ti_3O_5$ | 103.95 |
| 4 | Ag | 6.08 |
| 5 | $Ti_3O_5$ | 107.6 |
| 6 | Ag | 57.09 |
| 7 | $Ti_3O_5$ | 164.38 |
| 8 | Ag | 41.11 |
| 9 | $Ti_3O_5$ | 83.61 |

| Layer No. | Material | Thickness (nm) |
| --- | --- | --- |
| 1 | $TiO_5$ | 85.33 |
| 2 | Ag | 35.04 |
| 3 | $TiO_5$ | 84.7 |
| 4 | Ag | 1.83 |
| 5 | $TiO_5$ | 91.42 |
| 6 | Ag | 64.05 |
| 7 | $TiO_5$ | 161.88 |
| 8 | Ag | 42.43 |
| 9 | $TiO_5$ | 78.35 |

| Layer No. | Material | Thickness (nm) |
| --- | --- | --- |
| 1 | $Nb_2O_5$ | 86.45 |
| 2 | Ag | 35.04 |
| 3 | $Nb_2O_5$ | 85.82 |
| 4 | Ag | 1.83 |
| 5 | $Nb_2O_5$ | 92.63 |
| 6 | Ag | 64.05 |
| 7 | $Nb_2O_5$ | 164.01 |
| 8 | Ag | 42.43 |
| 9 | $Nb_2O_5$ | 79.39 |

| Layer No. | Material | Thickness (nm) |
| --- | --- | --- |
| 1 | $Ta_2O_5$ | 94.32 |
| 2 | Ag | 35.04 |
| 3 | $Ta_2O_5$ | 93.63 |
| 4 | Ag | 1.83 |
| 5 | $Ta_2O_5$ | 101.05 |
| 6 | Ag | 64.05 |
| 7 | $Ta_2O_5$ | 178.94 |
| 8 | Ag | 42.43 |
| 9 | $Ta_2O_5$ | 86.61 |

| Layer No. | Material | Thickness (nm) |
| --- | --- | --- |
| 1 | $H_4$ | 94.32 |
| 2 | Ag | 35.04 |
| 3 | $H_4$ | 93.63 |
| 4 | Ag | 1.83 |
| 5 | $H_4$ | 101.05 |
| 6 | Ag | 64.05 |
| 7 | $H_4$ | 178.94 |
| 8 | Ag | 42.43 |
| 9 | $H_4$ | 86.61 |

The present disclosure also provides for a method for manufacturing an optical filter structure for an arbitrary combination of R, G, B, and IR wavelength ranges, including the steps of (a) providing a substrate, (b) forming a photoresist mask having a plurality of hollowed out regions on a side of the substrate, (c) conducting vacuum plasma coating formation on the plurality of hollowed out regions to deposit a plurality of pixel filter films, wherein each of the pixel filter films within the plurality of pixel filter films is formed by stacking, in alternation, a plurality of silver (Ag) layers of varied thickness, and a plurality of high-refractive-index material layers with refractive indices higher than that of silver, (d) applying an additional layer of photoresist coating over the plurality of pixel filter films formed in step (c) so as to seal off the plurality of pixel filter films, (e) etching another plurality of hollowed out regions in the photoresist mask where another plurality of pixel filter films will be coated, and returning to step (c) until all desired pixel filter films have been formed, and (f) removing the photoresist mask.

In an embodiment, steps (c) to (e) are repeated until an optical filter structure composed of at least three types of pixel filter films is produced.

In an embodiment, step (b) further includes the following fabrication sub-steps: (b1) spin coating a layer of photoresist; (b2) soft baking; (b3) exposure; (b4) soft baking; (b5) developing; (b6) soft baking; and (b7) cleaning.

In an embodiment, step (c) is carried out in a vacuum reactive sputtering coating system, of which a sputtering target includes silver (Ag) and oxide materials whose refractive indices are higher than that of silver, and wherein step (c) further includes the following sub-steps: (c1) placing a clean substrate on a coating drum roller, with the side on which the photoresist mask is formed facing outwards; (c2) rotating the coating drum roller at a uniform speed in a coating chamber; (c3) releasing argon gas into the coating chamber, and activating a corresponding sputtering source when the coating chamber pressure reaches the range of 10-3 Pa to 10-5 Pa, such that the argon gas bombards and ionizes the sputtering target under the influence of an electric field; (c4) allowing ions originating from the sputtering target to attach to the substrate; (c5) bringing the substrate to a reaction source area, as the coating drum roller rotates; and (c6) introducing oxygen gas, argon gas, or a mixture thereof, into the reaction source area and, under the influence of the electric field, ionizing the oxygen or argon gas into plasma and driving the plasma toward the substrate at high speed such that silver layers or layers of other materials with refractive indices higher than that of silver are formed on the substrate.

In an embodiment, the oxide materials with refractive indices higher than that of silver are materials selected from the group consisting of trititanium pentoxide (Ti3O5), titanium dioxide (TiO2), niobium pentoxide (Nb2O5), tantalum pentoxide (Ta2O5), lanthanum titanium oxide (La2O7Ti2 or H4), and mixtures thereof.

In an embodiment, sub-step (c6) further includes controlling a thickness of the silver layers or layers of other materials with refractive indices higher than that of silver formed in sub-step (c6) by controlling a duration of time spent in the reaction source area where the duration of time spent in the reaction source area is directly correlated with the thickness of each layer.

In an embodiment, sub-step (c6) further includes controlling the characteristics of the silver layers formed in sub-step (c6) by controlling the percentage of oxygen by volume in an argon-oxygen gas mixture, where the refractive index and extinction coefficient of the silver layers formed in sub-step (c6) ranges from 0.1 to 2 and 5.8 to 23, respectively, over the wavelength range of 350 nm to 4000 nm as the oxygen percentage by volume of the argon-oxygen gas mixture ranges from 10% to 90%.

In an embodiment, sub-step (c6) further includes controlling the characteristics of the layers of other materials with refractive indices higher than that of silver formed in sub-step (c6) by controlling the percentage of oxygen by volume in an argon-oxygen gas mixture, where the refractive index of the layers of other materials with refractive indices higher than that of silver formed in sub-step (c6) ranges from 1.3 to 2.5, with an extinction coefficient of close to 0, over the wavelength range of 350 nm to 4000 nm, as the oxygen percentage by volume of the argon-oxygen gas mixture ranges from 10% to 90%.

BRIEF DESCRIPTION OF THE PREFERRED EMBODIMENTS

In the drawings, like elements are depicted by like reference numerals. The drawings are briefly described as follows.

FIG. 9 is a schematic diagram of a vacuum sputtering coating system according to the present invention The present disclosure now will be described more fully hereinafter with reference to the accompanying drawings, which show various example embodiments. However, the present disclosure may be embodied in many different forms and should not be construed as limited to the example embodiments set forth herein. Rather, these example embodiments are provided so that the present disclosure is thorough, complete, and fully conveys the scope of the present disclosure to those skilled in the art. In fact, it will be apparent to those skilled in the art that various modifications and variations can be made in the present invention without departing from the scope or spirit of the invention.

DETAILED DESCRIPTION OF THE PREFERRED EMBODIMENTS

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto in any manner whatsoever. In fact, those of ordinary skill in the art may appreciate upon reading the present specification and viewing the present drawings that various modifications and variations can be made thereto.

For purposes of the present disclosure of the invention, unless specifically disclaimed, the singular includes the plural and vice-versa, the words "and" and "or" shall be both conjunctive and disjunctive, the words "any" and "all" shall both mean "any and all".

Figure 1:
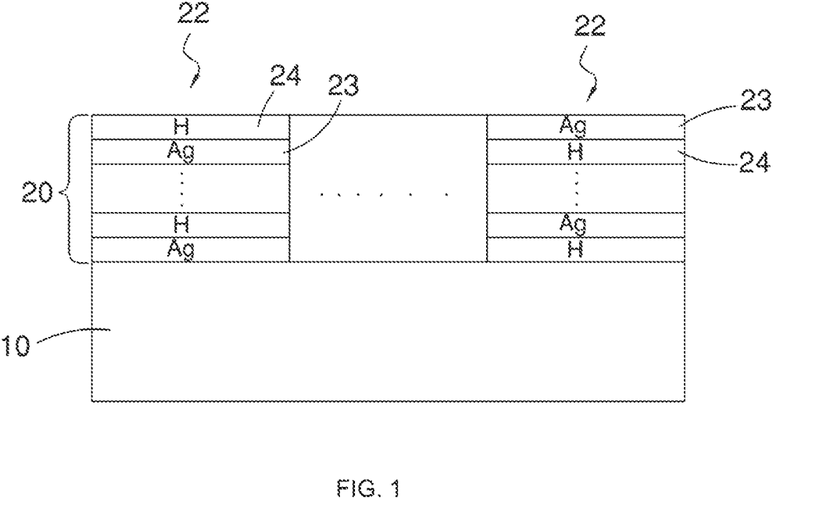
FIG. 1 is a cross-sectional view of a filter structure according to the present invention.
Figure 2:
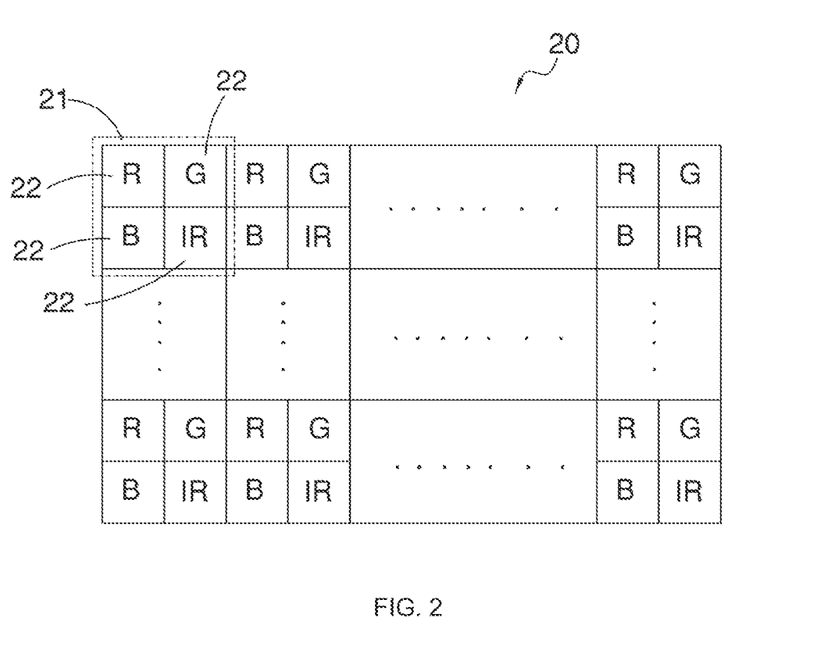
FIG. 2 is a cross-sectional view of a basic unit configuration of a filter layer according to the present invention.

An embodiment of the present invention provides, with reference to FIG. 1 and FIG. 2, an optical filter structure targeting an arbitrary combination of the spectral ranges of R (red), G (green), B (blue) and IR (infrared) light including a substrate 10, and a filter layer 20. In an embodiment, the substrate 10 is a wafer-based semiconductor sensing device. In an embodiment, the filter layer 20, which is formed on one side of the substrate 10, includes a plurality of basic units 21, organized as a two-dimensional array, preferably in which each of the basic units 21 is composed of a plurality of pixel filter films 22 formed by a vacuum coating method. In an embodiment, the plurality of pixel filter films 22 comprises an arbitrary combination of an R pixel filter film, a G pixel filter film, a B pixel filter film, and an IR pixel filter film, such that only the light whose wavelength lies in the passband of any pixel filter present in the basic unit is allowed to pass through.

In an embodiment of the present invention, the combination of a plurality of R, G, B and IR pixel filter films 22, configured in any of the basic units 21, can be any two types of pixel filter films, preferably any three types of pixel filter films, even more preferably all four types of pixel filter films. In an exemplary embodiment in accordance with the present invention, an optical filter structure comprises a combination of all four types of pixel filter films. In some embodiments, the optical filter structure includes an R pixel filter film, having a thickness of 300 nm to 900 nm, which is formed by stacking in alternation a plurality of silver (Ag) layers 23 and a plurality of high-refractive-index material layers 24 with refractive indices higher than the refractive index of silver. In an embodiment, the R pixel filter, associated with the R pixel filter film, is designed to have a passband formed in the range of 300 nm to 1100 nm together with a central wavelength ranging from 625 nm to 740 nm. In an embodiment, the R pixel filter has a transmittance less than 1% over the cut-off band, and has a transmittance greater than 55% over the central wavelength range when angle of incidence is 0°.

In some embodiments, the G pixel filter film, having a thickness of 300 nm to 900 nm, is formed by stacking in alternation a plurality of silver (Ag) layers 23 and a plurality of high-refractive-index material layers 24 with refractive indices higher than the refractive index of silver. In an embodiment, the G pixel filter, associated with the G pixel filter film, is designed to have a passband formed in the range of 300 nm to 1100 nm together with a central wavelength ranging from 500 nm to 565 nm. In an embodiment, the G pixel filter has a transmittance less than 1% over the cut-off band, and has a transmittance greater than 55% over the central wavelength range when angle of incidence is 0°.

In some embodiments, the B pixel filter film, having a thickness of 300 nm to 900 nm, is formed by stacking in alternation a plurality of silver (Ag) layers 23 and a plurality of high-refractive-index material layers 24 with refractive indices higher than the refractive index of silver. In an embodiment, the B pixel filter, associated with the B pixel filter film, is designed to have a passband formed in the range of 300 nm to 1100 nm together with a central wavelength ranging from 485 nm to 500 nm. In an embodiment, the B pixel filter has a transmittance less than 1% over the cut-off band, and has a transmittance greater than 55% over the central wavelength range when angle of incidence is 0°.

In some embodiments, the IR pixel filter film, having a thickness of 300 nm to 900 nm, is formed by stacking in alternation a plurality of silver (Ag) layers 23 and a plurality of high-refractive-index material layers 24 with refractive indices higher than the refractive index of silver. In an embodiment, the IR pixel filter, associated with the IR pixel filter film, is designed to have a passband formed in the range of 300 nm to 1100 nm together with a central wavelength in parts of the range of or partially overlapping with the range of 800 nm to 1100 nm. In an embodiment, the IR pixel filter has a transmittance less than 1% over the cut-off band, and has a transmittance greater than 30% over the central wavelength range when angle of incidence is 0°.

In some embodiments, the plurality of Ag layers 23 in any of the aforementioned plurality of pixel filter films 22 have a refractive index of 0.1 to 0.48 together with an extinction coefficient of 5.85 to 14.4 over the wavelength range of 350 nm to 2000 nm. In some embodiments, the plurality of high-refractive-index material layers 24 are each composed of at least one of the following materials: trititanium pentoxide ($Ti_3O_5$), titanium dioxide ($TiO_2$), niobium pentoxide ($Nb_2O_5$), tantalum pentoxide ($Ta_2O_5$), and lanthanum titanium oxide ($La_2O_7Ti_2$ or H4), and a mixture thereof. In some embodiments, the plurality of high-refractive-index material layers 24 have a refractive index of greater than 1.6 together with an extinction coefficient of close to zero over the wavelength range of 350 nm to 1100 nm. In some embodiments, by stacking alternately a plurality of Ag layers 23 of varied thickness and varied number of repetition and a plurality of high-refractive-index material layers 24 correspondingly, an R pixel filter film, a G pixel filter film, a B pixel filter film, or an IR pixel filter film can be formed.

In an exemplary embodiment of the present invention, the optical filter structure comprises an R pixel filter film where the R pixel filter film, with a total coating thickness in the range around 400-800 nm, is formed by stacking in alternation a plurality of Ag layers 23 and a plurality of high-refractive-index material layers 24. In an exemplary embodiment, the R pixel filter film comprises a plurality of Ag layers 23 which have a refractive index of 0.1 to 0.48 together with an extinction coefficient of 5.85 to 14.4 over the wavelength range of 350 nm to 2000 nm. In some embodiments, the R pixel filter film comprises a plurality of high-refractive-index material layers 24, where suitable materials for the high-refractive-index material layers 24, in accordance with the present invention, include trititanium pentoxide ($Ti_3O_5$), titanium dioxide ($TiO_2$), niobium pentoxide ($Nb_2O_5$), tantalum pentoxide ($Ta_2O_5$), and lanthanum titanium oxide ($La_2O_7Ti_2$ or H4). Preferably, the trititanium pentoxide ($Ti_3O_5$) layer has a refractive index of greater than 2.5 and an extinction coefficient of close to zero over the wavelength range of 350 nm to 1100 nm. The structural conditions of some exemplary embodiments of an R pixel filter of the present invention are shown in the tables as follows:

| Layer No. | Material | Thickness (nm) |
|---|---|---|
| 1 | $Ti_3O_5$ | 127.04 |
| 2 | Ag | 8.19 |
| 3 | $Ti_3O_5$ | 85.41 |

-continued

| Layer No. | Material | Thickness (nm) |
|---|---|---|
| 4 | Ag | 30.79 |
| 5 | Ti$_3$O$_5$ | 96.8 |
| 6 | Ag | 39.63 |
| 7 | Ti$_3$O$_5$ | 96.89 |
| 8 | Ag | 26.69 |
| 9 | Ti$_3$O$_5$ | 56.23 |

| Layer No. | Material | Thickness (nm) |
|---|---|---|
| 1 | TiO$_5$ | 58.98 |
| 2 | Ag | 19.6 |
| 3 | TiO$_5$ | 94.78 |
| 4 | Ag | 32.64 |
| 5 | TiO$_5$ | 93.18 |
| 6 | Ag | 31.49 |
| 7 | TiO$_5$ | 90.07 |
| 8 | Ag | 23.19 |
| 9 | TiO$_5$ | 47.71 |

| Layer No. | Material | Thickness (nm) |
|---|---|---|
| 1 | Nb$_2$O$_5$ | 59.51 |
| 2 | Ag | 19.6 |
| 3 | Nb$_2$O$_5$ | 95.63 |
| 4 | Ag | 32.64 |
| 5 | Nb$_2$O$_5$ | 94.02 |
| 6 | Ag | 31.49 |
| 7 | Nb$_2$O$_5$ | 90.88 |
| 8 | Ag | 23.19 |
| 9 | Nb$_2$O$_5$ | 48.14 |

| Layer No. | Material | Thickness (nm) |
|---|---|---|
| 1 | Ta$_2$O$_5$ | 63.94 |
| 2 | Ag | 19.6 |
| 3 | Ta$_2$O$_5$ | 102.74 |
| 4 | Ag | 32.64 |
| 5 | Ta$_2$O$_5$ | 101.01 |
| 6 | Ag | 31.49 |
| 7 | Ta$_2$O$_5$ | 97.64 |
| 8 | Ag | 23.19 |
| 9 | Ta$_2$O$_5$ | 51.72 |

| Layer No. | Material | Thickness (nm) |
|---|---|---|
| 1 | H$_4$ | 64.89 |
| 2 | Ag | 19.6 |
| 3 | H$_4$ | 104.28 |
| 4 | Ag | 32.64 |
| 5 | H$_4$ | 102.52 |
| 6 | Ag | 31.49 |
| 7 | H$_4$ | 99.1 |
| 8 | Ag | 23.19 |
| 9 | H$_4$ | 52.5 |

Figure 3:
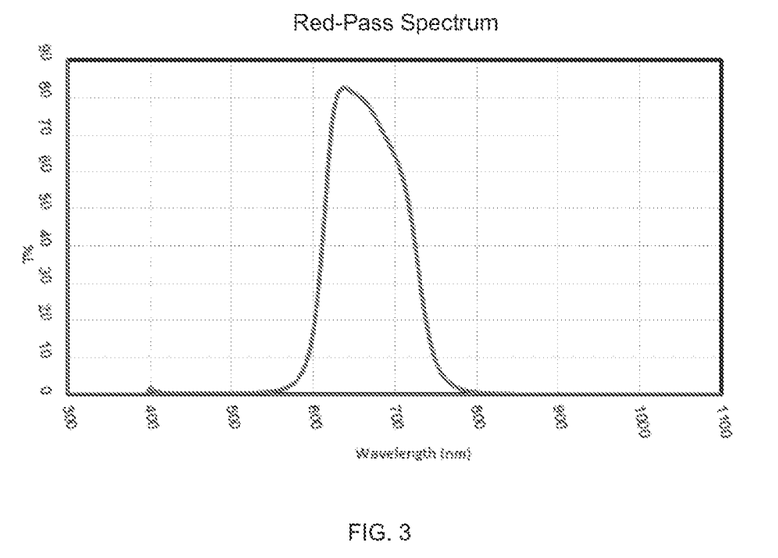
FIG. 3 is a transmittance spectrum of a red filter pixel film according to the present invention.

In some exemplary embodiments, with reference to FIG. 3, the transmittance spectrum of an R pixel filter is shown to have a passband formed in the range of 300 nm to 1100 nm together with a central wavelength ranging from 625 nm to 740 nm. In some exemplary embodiments, R pixel filter has a transmittance less than 1% over the cut-off band, and has a transmittance greater than 55% over the central wavelength range when the angle of incidence is 0°.

In some embodiments, the G pixel filter film, with a total coating thickness in the range around 150-450 nm, is formed by stacking in alternation a plurality of Ag layers 23 of varied thickness and a plurality of high-refractive-index material layers 24. In some embodiments, the G pixel filter film comprises a plurality of Ag layers 23, which each have a refractive index of 0.1 to 0.48 together with an extinction coefficient of 5.85 to 14.4 over the wavelength range of 350 nm to 2000 nm. In some embodiments, the G pixel filter film comprises a plurality of high-refractive-index material layers 24, where suitable materials for the high-refractive-index material layers 24, in accordance with the present invention, include trititanium pentoxide (Ti3O5), titanium dioxide (TiO2), niobium pentoxide (Nb2O5), tantalum pentoxide (Ta2O5), and lanthanum titanium oxide (La2O7Ti2 or H4). Preferably, the trititanium pentoxide (Ti3O5) has a refractive index of greater than 2.5 and an extinction coefficient of close to zero over the wavelength range of 350 nm to 1100 nm. The structural conditions of some exemplary embodiments of G pixel filter of the present invention are shown in the tables as follows:

| Layer No. | Material | Thickness (nm) |
|---|---|---|
| 1 | Ag | 15.13 |
| 2 | Ti$_3$O$_5$ | 60.13 |
| 3 | Ag | 40.44 |
| 4 | Ti$_3$O$_5$ | 66.48 |
| 5 | Ag | 41.96 |
| 6 | Ti$_3$O$_5$ | 71.85 |
| 7 | Ag | 19.18 |
| 8 | Ti$_3$O$_5$ | 62.52 |

| Layer No. | Material | Thickness (nm) |
|---|---|---|
| 1 | Ag | 15.13 |
| 2 | TiO$_5$ | 60.14 |
| 3 | Ag | 40.44 |
| 4 | TiO$_5$ | 66.49 |
| 5 | Ag | 41.96 |
| 6 | TiO$_5$ | 71.85 |
| 7 | Ag | 19.18 |
| 8 | TiO$_5$ | 62.52 |

| Layer No. | Material | Thickness (nm) |
|---|---|---|
| 1 | Ag | 15.13 |
| 2 | Nb$_2$O$_5$ | 60.95 |
| 3 | Ag | 40.44 |
| 4 | Nb$_2$O$_5$ | 67.39 |
| 5 | Ag | 41.96 |
| 6 | Nb$_2$O$_5$ | 72.82 |
| 7 | Ag | 19.18 |
| 8 | Nb$_2$O$_5$ | 63.37 |

| Layer No. | Material | Thickness (nm) |
|---|---|---|
| 1 | Ag | 15.13 |
| 2 | Ta$_2$O$_5$ | 65.42 |
| 3 | Ag | 40.44 |
| 4 | Ta$_2$O$_5$ | 72.33 |
| 5 | Ag | 41.96 |
| 6 | Ta$_2$O$_5$ | 78.16 |
| 7 | Ag | 19.18 |
| 8 | Ta$_2$O$_5$ | 68.02 |

| Layer No. | Material | Thickness (nm) |
|---|---|---|
| 1 | Ag | 15.13 |
| 2 | H4 | 66.94 |
| 3 | Ag | 40.44 |
| 4 | H4 | 74.01 |
| 5 | Ag | 41.96 |
| 6 | H4 | 79.98 |
| 7 | Ag | 19.18 |
| 8 | H4 | 69.59 |

Figure 4:
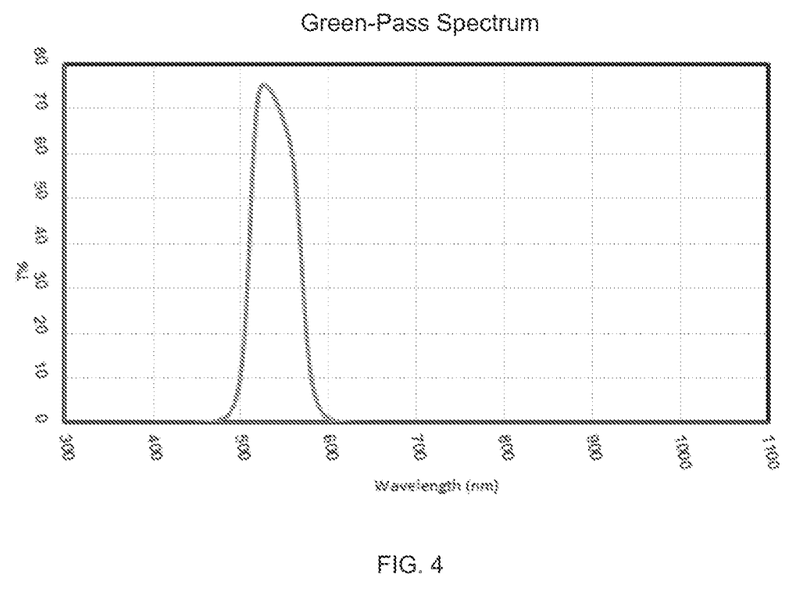
FIG. 4 is a transmittance spectrum of a green pixel filter film according to the present invention.

In some exemplary embodiments, with reference to FIG. 4, the transmittance spectrum of a G pixel filter is shown to have a passband formed in the range of 300 nm to 1100 nm together with a central wavelength ranging from 500 nm to 565 nm. In some exemplary embodiments, the G pixel filter has a transmittance less than 1% over the cut-off band, and has a transmittance greater than 55% over the central wavelength range when the angle of incidence is 0°.

In some embodiments, the B pixel filter film, with a total coating thickness in the range around 200-600 nm, is formed by stacking in alternation a plurality of Ag layers 23 of varied thickness and a plurality of high-refractive-index material layers 24. In some embodiments, the B pixel filter film comprises a plurality of Ag layers 23, which each have a refractive index of 0.1 to 0.48 together with an extinction coefficient of 5.85 to 14.4 over the wavelength range of 350 nm to 2000 nm. In some embodiments, the B pixel filter film comprises a plurality of high-refractive-index material layers 24, where suitable materials for the high-refractive-index material layers 24, in accordance with the present invention, include trititanium pentoxide ($Ti_3O_5$), titanium dioxide ($TiO_2$), niobium pentoxide ($Nb_2O_5$), tantalum pentoxide ($Ta_2O_5$), and lanthanum titanium oxide ($La_2O_7Ti_2$ or H4). Preferably, the trititanium pentoxide ($Ti_3O_5$) has a refractive index of greater than 2.5 and an extinction coefficient of close to zero over the wavelength range of 350 nm to 1100 nm. The structural conditions of some exemplary embodiments of B pixel filter of the present invention are shown in the tables as follows:

| Layer No. | Material | Thickness (nm) |
|---|---|---|
| 1 | $Ti_3O_5$ | 45.96 |
| 2 | Ag | 13.79 |
| 3 | $Ti_3O_5$ | 149.81 |
| 4 | Ag | 35.72 |
| 5 | $Ti_3O_5$ | 51.02 |
| 6 | Ag | 35.93 |
| 7 | $Ti_3O_5$ | 27.34 |

| Layer No. | Material | Thickness (nm) |
|---|---|---|
| 1 | $TiO_5$ | 46.17 |
| 2 | Ag | 13.79 |
| 3 | $TiO_5$ | 150.49 |
| 4 | Ag | 35.72 |
| 5 | $TiO_5$ | 51.25 |
| 6 | Ag | 35.93 |
| 7 | $TiO_5$ | 27.47 |

| Layer No. | Material | Thickness (nm) |
|---|---|---|
| 1 | $Nb_2O_5$ | 46.81 |
| 2 | Ag | 13.79 |
| 3 | $Nb_2O_5$ | 152.6 |
| 4 | Ag | 35.72 |
| 5 | $Nb_2O_5$ | 51.97 |
| 6 | Ag | 35.93 |
| 7 | $Nb_2O_5$ | 27.85 |

| Layer No. | Material | Thickness (nm) |
|---|---|---|
| 1 | $Ta_2O_5$ | 50.78 |
| 2 | Ag | 13.79 |
| 3 | $Ta_2O_5$ | 165.54 |
| 4 | Ag | 35.72 |
| 5 | $Ta_2O_5$ | 56.38 |
| 6 | Ag | 35.93 |
| 7 | $Ta_2O_5$ | 30.22 |

| Layer No. | Material | Thickness (nm) |
|---|---|---|
| 1 | H4 | 52.15 |
| 2 | Ag | 13.79 |
| 3 | H4 | 170 |
| 4 | Ag | 35.72 |
| 5 | H4 | 57.9 |
| 6 | Ag | 35.93 |
| 7 | H4 | 31.03 |

Figure 5:
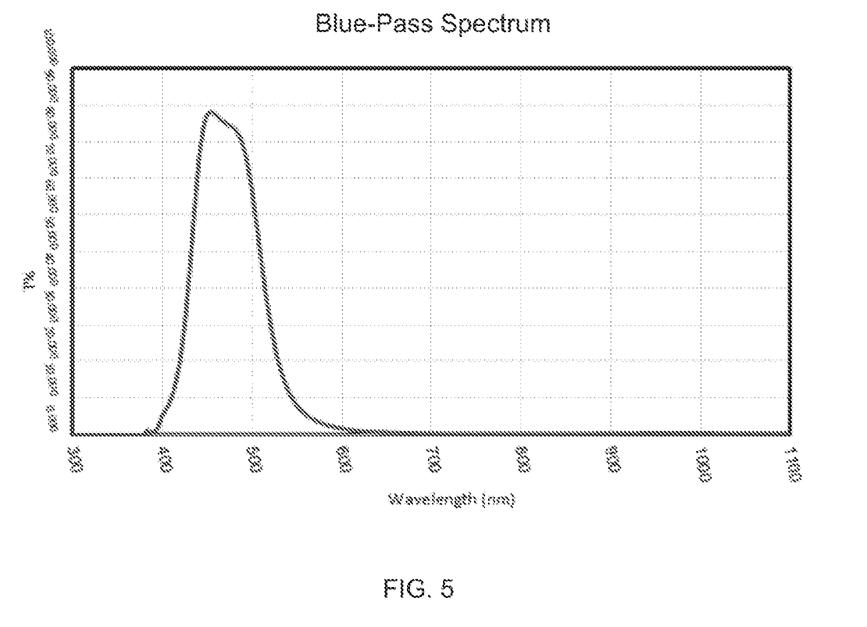
FIG. 5 is a transmittance spectrum of a blue pixel filter film according to the present invention.

In some exemplary embodiments, with reference to FIG. 5, the transmittance spectrum of a B pixel filter is shown to have a passband formed in the range of 300 nm to 1100 nm together with a central wavelength ranging from 485 nm to 500 nm. In some exemplary embodiments, the B pixel filter has a transmittance less than 1% over the cut-off band, and has a transmittance greater than 55% over the central wavelength range when the angle of incidence is 0°.

In some embodiments, the IR pixel filter film, with a total coating thickness in the range around 300-900 nm, is formed by stacking in alternation a plurality of Ag layers 23 of varied thickness and a plurality of high-refractive-index material layers 24. In some embodiments, the IR pixel filter film comprises a plurality of Ag layers 23, which each have a refractive index of 0.1 to 0.48 together with an extinction coefficient of 5.85 to 14.4 over the wavelength range of 350 nm to 2000 nm. In some embodiments, the IR pixel filter film comprises a plurality of high-refractive-index material layers 24, where suitable materials for the high-refractive-index material layers 24, in accordance with the present invention, include trititanium pentoxide ($Ti_3O_5$), titanium dioxide ($TiO_2$), niobium pentoxide ($Nb_2O_5$), tantalum pentoxide ($Ta_2O_5$), and lanthanum titanium oxide ($La_2O_7Ti_2$ or H4). Preferably, the trititanium pentoxide ($Ti_3O_5$) has a refractive index of greater than 2.5 and an extinction coefficient of close to zero over the wavelength range of 350 nm to 1100 nm. The structural conditions of some exemplary embodiments of an IR pixel filter of the present invention are shown in the tables as follows:

| Layer No. | Material | Thickness (nm) |
|---|---|---|
| 1 | $Ti_3O_5$ | 82.56 |
| 2 | Ag | 25.75 |
| 3 | $Ti_3O_5$ | 130.95 |

-continued

| Layer No. | Material | Thickness (nm) |
|---|---|---|
| 4 | Ag | 6.08 |
| 5 | Ti$_3$O$_5$ | 107.6 |
| 6 | Ag | 57.09 |
| 7 | Ti$_3$O$_5$ | 164.38 |
| 8 | Ag | 41.11 |
| 9 | Ti$_3$O$_5$ | 83.61 |

| Layer No. | Material | Thickness (nm) |
|---|---|---|
| 1 | TiO$_2$ | 85.33 |
| 2 | Ag | 35.04 |
| 3 | TiO$_2$ | 84.7 |
| 4 | Ag | 1.83 |
| 5 | TiO$_2$ | 91.42 |
| 6 | Ag | 64.05 |
| 7 | TiO$_2$ | 161.88 |
| 8 | Ag | 42.43 |
| 9 | TiO$_2$ | 78.35 |

| Layer No. | Material | Thickness (nm) |
|---|---|---|
| 1 | Nb$_2$O$_5$ | 86.45 |
| 2 | Ag | 35.04 |
| 3 | Nb$_2$O$_5$ | 85.82 |
| 4 | Ag | 1.83 |
| 5 | Nb$_2$O$_5$ | 92.63 |
| 6 | Ag | 64.05 |
| 7 | Nb$_2$O$_5$ | 164.01 |
| 8 | Ag | 42.43 |
| 9 | Nb$_2$O$_5$ | 79.39 |

| Layer No. | Material | Thickness (nm) |
|---|---|---|
| 1 | Ta$_2$O$_5$ | 94.32 |
| 2 | Ag | 35.04 |
| 3 | Ta$_2$O$_5$ | 93.63 |
| 4 | Ag | 1.83 |
| 5 | Ta$_2$O$_5$ | 101.05 |
| 6 | Ag | 64.05 |
| 7 | Ta$_2$O$_5$ | 178.94 |
| 8 | Ag | 42.43 |
| 9 | Ta$_2$O$_5$ | 86.61 |

| Layer No. | Material | Thickness (nm) |
|---|---|---|
| 1 | H$_4$ | 94.32 |
| 2 | Ag | 35.04 |
| 3 | H$_4$ | 93.63 |
| 4 | Ag | 1.83 |
| 5 | H$_4$ | 101.05 |
| 6 | Ag | 64.05 |
| 7 | H$_4$ | 178.94 |
| 8 | Ag | 42.43 |
| 9 | H$_4$ | 86.61 |

Figure 6:
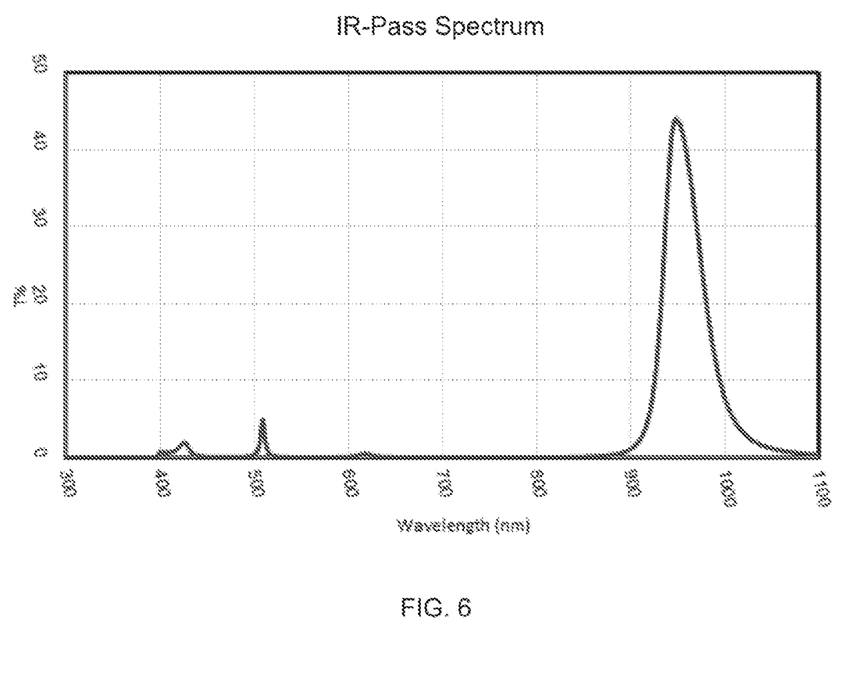
FIG. 6 is a transmittance spectrum of an infrared pixel filter film according to the present invention.

In some exemplary embodiments, with reference to FIG. 6, the transmittance spectrum of an IR pixel filter is shown to have a passband formed in the range of 300 nm to 1100 nm together with a central wavelength in parts of the range of 800 nm to 1100 nm, or at least partially overlapping with the range of 800 nm to 1100 nm. Further, the same IR pixel filter has a transmittance less than 1% over the cut-off band, and has a transmittance greater than 30% over the central wavelength range when the angle of incidence is 0°.

Figure 7:
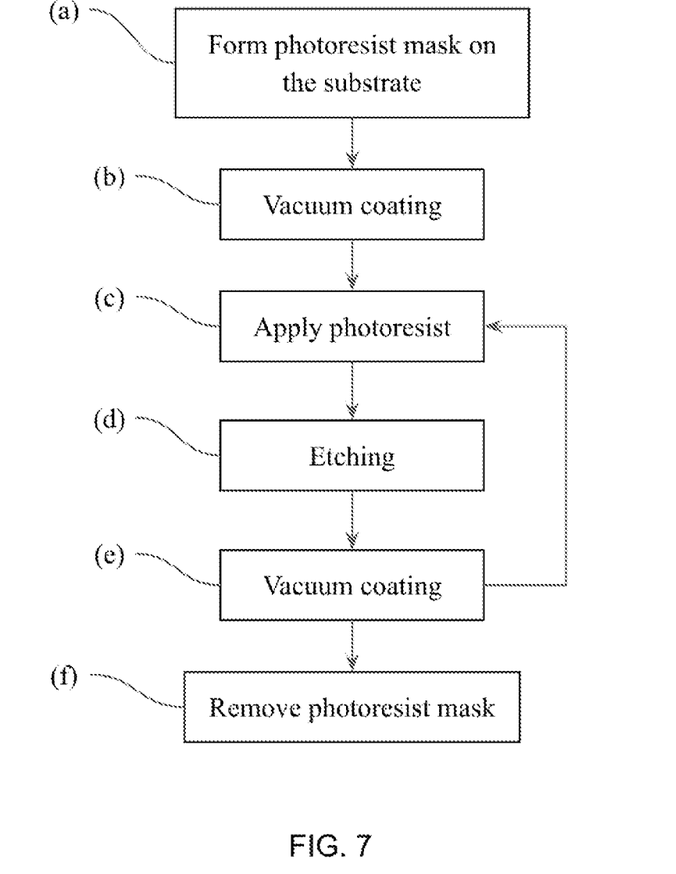
FIG. 7 is a flowchart of a manufacturing process according to the present invention.

An embodiment of the present invention provides, with reference to FIG. 7, a manufacturing method for an optical filter structure targeting an arbitrary combination of R, G, B and IR wavelength regions in the present invention comprising one or more of the following steps: (a) providing a substrate; (b) forming a photoresist mask on the substrate 10: a photoresist mask, having a plurality of hollowed out regions where the pixel filter films 22 are coated, is formed on one side of the substrate 10; (c) conducting vacuum coating: the vacuum plasma method of coating formation is applied to the coating areas to deposit a plurality of pixel filter films 22 which are formed each by stacking in alternation a plurality of silver (Ag) layers 23 of varied thickness and a plurality of high-refractive-index material layers 24 with refractive indices higher than the refractive index of silver; (d) applying photoresist: a layer of photoresist coating is formed over the coating areas of the photoresist mask so as to seal the regions of pixel filter films that have been coated by the vacuum coating process described in step (c); (e) etching: the etching process is applied to a plurality of other coating areas on the photoresist mask by forming a plurality of hollowed out regions where a plurality of other pixel filter films 22 are coated; (f) re-conducting vacuum coating: the process of vacuum coating is reapplied on the areas etched for forming another plurality of pixel filter films; (g) removing photoresist mask: the photoresist is removed, thereby completing the fabrication process. In some embodiments, steps (c) to (e) can be repeated as needed to produce a filter structure composed of three or four types of pixel filter films.

In an exemplary embodiment, a plurality of hollowed out regions are formed on the photoresist mask which correspond to the coating areas for the R pixel filter films. In an exemplary embodiment, of making the R pixel filter films, an R pixel filter film is deposited on each of the coating areas that are reserved for the R pixel filter films by means of the vacuum coating process. In an embodiment, of making the G pixel filter films, after finishing the vacuum coating and sealing steps of R pixel filter films, a plurality of hollowed out regions are formed on the photoresist mask which correspond to the coating areas for the G pixel filter films.

Figure 8:
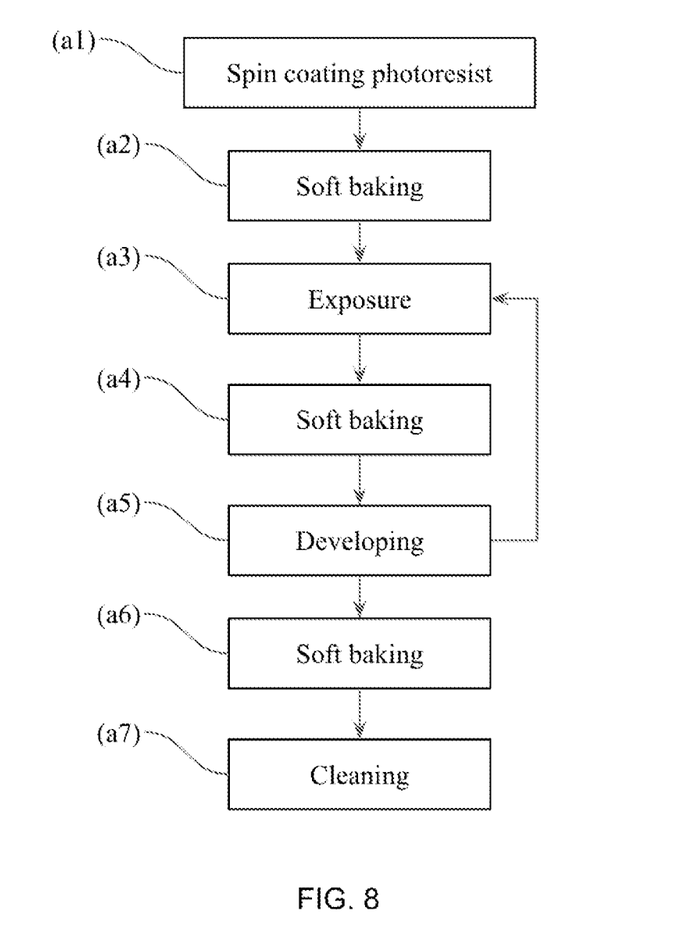
FIG. 8 is a flowchart of a manufacturing process for making a photoresist mask according to the present invention.

In an embodiment, with reference to FIG. 8, the formation of a photoresist mask on the substrate 10 further includes the following fabrication steps: (a1) spin coating photoresist, (a2) soft baking, (a3) exposure, (a4) soft baking, (a5) developing, (a6) soft baking, and (a7) cleaning.

Figure 9:
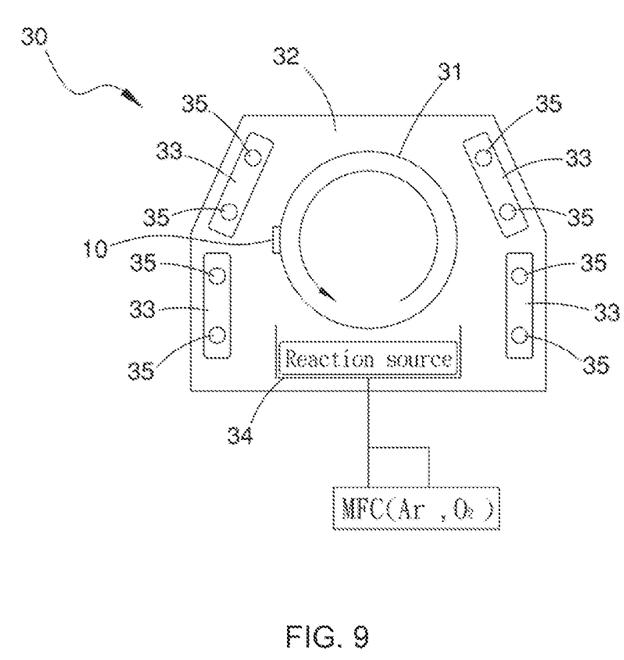

In an embodiment, with reference to FIG. 9, the vacuum coating process is carried out in a vacuum reactive sputtering coating system 30, of which the sputtering target 35 primarily consists of silver (Ag) and the oxide materials whose refractive indices are higher than the refractive index of silver, which include trititanium pentoxide (Ti3O5), titanium dioxide (TiO2), niobium pentoxide (Nb2O5), tantalum pentoxide (Ta2O5), and lanthanum titanium oxide (La2O7Ti2 or H4), and the mixture thereof. In some embodiments, the process of vacuum sputter coating further includes the following steps: (A) place a clean substrate 10 on the coating drum roller 31, with the side of the substrate for coating the filter layer 20 facing outwards, (B) make the coating drum roller 31 rotate at an uniform speed in the coating chamber 32, (C) the corresponding sputtering source 33 is turned on while argon gas is released into the coating chamber 32, when the chamber pressure reaches the range of 10 e−3 Pa to 10 e−5 Pa, such that the argon gas bombards and ionizes the sputtering target 35 under the influence of the electric field. The ions originated from the sputtering target 35 then attach to the substrate 10, (D) as the coating drum roller 31 rotates, the substrate 10 is brought to the reaction source area 34, and (E) oxygen or argon gas is introduced into the reaction area 34 and, under the influence of the electric field, ionized into plasma and driven toward the substrate 10 at high speed. Consequently, silver layers or layers of other materials with refractive indices higher than that of silver are formed on the substrate 10.

In some embodiments, a clean substrate 10 is initially placed on the coating drum roller 31, which rotates counterclockwise at an adjustable speed. The substrate 10 to be coated first passes through the sputtering target 35, where a thin layer of silver or a material with a refractive index higher than that of silver is deposited. Through rotation, the substrate 10 is then brought to the reaction area 34, where optical thin films with the required characteristics are chemically synthesized by the composition of ionized particles including oxygen ions and electrons. The thickness of each coated layer can be controlled by the time duration spent in coating such that the longer the time, the thicker the layer becomes.

In some embodiments, for producing Ag thin films, when the volume percentage of the oxygen content in the argon-oxygen mixture gas is varied from 10% to 90%, the refractive index and extinction coefficient of the resulting Ag thin film changes from 0.1 to 2 and 5.8 to 23, respectively, over the wavelength range of 350 nm to 4000 nm. In some embodiments, for producing high-refractive index thin films, when the volume percentage of the oxygen content in the argon-oxygen mixture gas is varied from 10% to 90%, the refractive index of the resulting thin film whose refractive index is higher than that of silver changes from 1.3 to 2.5 over the wavelength range of 350 nm to 1100 nm, while its extinction coefficient is close to zero.

Accordingly, by using the process of vacuum coating and the method for manufacturing photoresist mask, the optical filter structure and its manufacturing method for an arbitrary combination of the spectral ranges of red, green, blue and infrared light, as disclosed in the present invention, can meet the specification requirements of film uniformity of within ±5 nm and optical transmittance of less than 1% in the cut-off band, as well as a film thickness of 300 nm to 900 nm even with a large substrate size.

Therefore, when applying to the sensing chip of optical sensors such as ambient light sensor (ALS), proximity sensor (PS), RGB color temperature sensor chip and gesture sensor chip, the optical filter structure and its manufacturing method provided by this invention can greatly reduce the reaction time, enhance substantially the color resolution and the sensitivity adjustment of the same product, as well as significantly improve its photosensitivity. Moreover, since the thickness of R, G, B, and IR filter films, as disclosed in the preferred embodiment of the present invention, ranges between 300 nm and 900 nm, the manufacturing method of this invention can be applied in nano-manufacturing technology products.

It is understood that when an element is referred hereinabove as being "on" another element, it can be directly on the other element or intervening elements may be present therebetween. In contrast, when an element is referred to as being "directly on" another element, there are no intervening elements present.

Moreover, any components or materials can be formed from a same, structurally continuous piece or separately fabricated and connected.

It is further understood that, although ordinal terms, such as, "first," "second," and "third," are used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, a "first element," "component," "region," "layer" and/or "section" discussed below could be termed a second element, component, region, layer and/or section without departing from the teachings herein.

Features illustrated or described as part of one embodiment can be used with another embodiment and such variations come within the scope of the appended claims and their equivalents.

Spatially relative terms, such as "beneath," "below," "lower," "above," "upper" and the like, are used herein for ease of description to describe one element or feature's relationship to another element(s) or feature(s) as illustrated in the figures. It is understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device can be otherwise oriented (rotated 90 degrees or at other orientations) and the spatially relative descriptors used herein interpreted accordingly.

Example embodiments are described herein with reference to cross section illustrations that are schematic illustrations of idealized embodiments. As such, variations from the shapes of the illustrations, for example, of manufacturing techniques and/or tolerances, are to be expected. Thus, example embodiments described herein should not be construed as limited to the particular shapes of regions as illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

In conclusion, herein is presented an optical filter structure targeting an arbitrary combination of the spectral ranges of R (red), G (green), B (blue) and IR (infrared) light and a method of manufacturing such optical filter structure. The disclosure is illustrated by example in the drawing figures, and throughout the written description. It should be understood that numerous variations are possible while adhering to the inventive concept. Such variations are contemplated as being a part of the present disclosure.

What is claimed is:

1. An optical filter structure for an arbitrary combination of R, G, B, and IR wavelength ranges, comprising:
a substrate; and
a filter layer formed on one side of the substrate,
wherein the substrate is a wafer-based semiconductor sensing device,
wherein the filter layer comprises a plurality of basic units organized as a two-dimensional array,
wherein each of the basic units comprises a plurality of pixel filter films formed by a vacuum coating method,
wherein the plurality of pixel filter films comprises an arbitrary combination of an R pixel filter film, a G pixel filter film, a B pixel filter film, and an IR pixel filter film, configured such that each pixel filter present in the basic unit only permits light having a wavelength within its passband to pass through,
wherein the filter layer is formed by stacking the plurality of pixel filter films; and
wherein each of the plurality of pixel filter films has a film thickness uniformity of within ±5 nm.

2. The optical filter structure of claim 1, wherein:
the R pixel filter film is formed by stacking, in alternation, a first plurality of silver (Ag) layers and a first plurality of high-refractive-index material layers with refractive indices higher than that of silver, such that the R pixel filter film has a thickness of 300 nm to 900 nm, the R pixel filter film has a passband with a range of 300 nm to 1100 nm with a central wavelength ranging from 625 nm to 740 nm, the R pixel filter film has a transmittance less than 1% over the cut-off band, and the R pixel filter film has a transmittance greater than 55% over the central wavelength range when the angle of incidence of incoming light is 0°;
the G pixel filter film is formed by stacking, in alternation, a second plurality of silver (Ag) layers and a second plurality of high-refractive-index material layers with refractive indices higher than that of silver, such that the G pixel filter film has a thickness of 300 nm to 900 nm, the G pixel filter film has a passband with a range of 300 nm to 1100 nm with a central wavelength ranging from 500 nm to 565 nm, the G pixel filter film has a transmittance less than 1% over the cut-off band, and the G pixel filter film has a transmittance greater than 55% over the central wavelength range when the angle of incidence of incoming light is 0°;
the B pixel filter film is formed by stacking, in alternation, a third plurality of silver (Ag) layers and a third plurality of high-refractive-index material layers with refractive indices higher than that of silver, such that the B pixel filter film has a thickness of 300 nm to 900 nm, the B pixel filter film has a passband with a range of 300 nm to 1100 nm with a central wavelength ranging from 485 nm to 500 nm, the B pixel filter film has a transmittance less than 1% over the cut-off band, and the B pixel filter film has a transmittance greater than 55% over the central wavelength range when the angle of incidence of incoming light is 0°; and
the IR pixel filter film is formed by stacking, in alternation, a fourth plurality of silver (Ag) layers and a fourth plurality of high-refractive-index material layers with refractive indices higher than that of silver, such that the IR pixel filter film has a thickness of 300 nm to 900 nm, the IR pixel filter film has a passband with a range of 300 nm to 1100 nm with a central wavelength at least partially overlapping with the range of 800 nm to 1100 nm, the IR pixel filter film has a transmittance less than 1% over the cut-off band, and the IR pixel filter film has a transmittance greater than 30% over the central wavelength range when the angle of incidence of incoming light is 0°.

3. The optical filter structure of claim 2, wherein each of the layers within the first, second, third, and fourth plurality of Ag layers has a refractive index of 0.1 to 0.48 together with an extinction coefficient of 5.85 to 14.4 over the wavelength range of 350 nm to 2000 nm, and wherein each of the layers within the first, second, third, and fourth plurality of high-refractive-index material layers has a refractive index of greater than 1.6 together with an extinction coefficient of close to zero over the wavelength range of 350 nm to 1100 nm.

4. The optical filter structure of claim 3, wherein each of the layers within the first, second, third, and fourth plurality of high-refractive-index material layers is composed of a material selected from the group consisting of trititanium pentoxide (Ti3O5), titanium dioxide (TiO2), niobium pentoxide (Nb2O5), tantalum pentoxide (Ta2O5), lanthanum titanium oxide (La2O7Ti2 or H4), and mixtures thereof.

5. The optical filter structure of claim 3, wherein the R pixel filter film is formed Sot at it has the structure shown in one of the following tables:

| LAyer No. | MAterIAl | ThIckness (nm) |
|---|---|---|
| 1 | $Ti_3O_5$ | 127.04 |
| 2 | AG | 8.19 |
| 3 | $Ti_3O_5$ | 85.41 |
| 4 | AG | 30.79 |
| 5 | $Ti_3O_5$ | 96.8 |
| 6 | AG | 39.63 |
| 7 | $Ti_3O_5$ | 96.89 |
| 8 | AG | 26.69 |
| 9 | $Ti_3O_5$ | 56.23 |

| LAyer No. | MAterIAl | ThIckness (nm) |
|---|---|---|
| 1 | $TiO_5$ | 58.98 |
| 2 | AG | 19.6 |
| 3 | $TiO_5$ | 94.78 |
| 4 | AG | 32.64 |
| 5 | $TiO_5$ | 93.18 |
| 6 | AG | 31.49 |
| 7 | $TiO_5$ | 90.07 |
| 8 | AG | 23.19 |
| 9 | $TiO_5$ | 47.71 |

| LAyer No. | MAterIAl | ThIckness (nm) |
|---|---|---|
| 1 | $Nb_2O_5$ | 59.51 |
| 2 | AG | 19.6 |
| 3 | $Nb_2O_5$ | 95.63 |

-continued

| Layer No. | Material | Thickness (nm) |
|---|---|---|
| 4 | Ag | 32.64 |
| 5 | Nb$_2$O$_5$ | 94.02 |
| 6 | Ag | 31.49 |
| 7 | Nb$_2$O$_5$ | 90.88 |
| 8 | Ag | 23.19 |
| 9 | Nb$_2$O$_5$ | 48.14 |

| Layer No. | Material | Thickness (nm) |
|---|---|---|
| 1 | Ta$_2$O$_5$ | 63.94 |
| 2 | Ag | 19.6 |
| 3 | Ta$_2$O$_5$ | 102.74 |
| 4 | Ag | 32.64 |
| 5 | Ta$_2$O$_5$ | 101.01 |
| 6 | Ag | 31.49 |
| 7 | Ta$_2$O$_5$ | 97.64 |
| 8 | Ag | 23.19 |
| 9 | Ta$_2$O$_5$ | 51.72 |

| Layer No. | Material | Thickness (nm) |
|---|---|---|
| 1 | H$_4$ | 64.89 |
| 2 | Ag | 19.6 |
| 3 | H$_4$ | 104.28 |
| 4 | Ag | 32.64 |
| 5 | H$_4$ | 102.52 |
| 6 | Ag | 31.49 |
| 7 | H$_4$ | 99.1 |
| 8 | Ag | 23.19 |
| 9 | H$_4$ | 52.5 |

6. The optical filter structure of claim 3, wherein the G pixel filter film is formed so that it has the structure shown in one of the following tables:

| Layer No. | Material | Thickness (nm) |
|---|---|---|
| 1 | Ag | 15.13 |
| 2 | Ti$_3$O$_5$ | 60.13 |
| 3 | Ag | 40.44 |
| 4 | Ti$_3$O$_5$ | 66.48 |
| 5 | Ag | 41.96 |
| 6 | Ti$_3$O$_5$ | 71.85 |
| 7 | Ag | 19.18 |
| 8 | Ti$_3$O$_5$ | 62.52 |

| Layer No. | Material | Thickness (nm) |
|---|---|---|
| 1 | Ag | 15.13 |
| 2 | TiO$_5$ | 60.14 |
| 3 | Ag | 40.44 |
| 4 | TiO$_5$ | 66.49 |
| 5 | Ag | 41.96 |
| 6 | TiO$_5$ | 71.85 |
| 7 | Ag | 19.18 |
| 8 | TiO$_5$ | 62.52 |

| Layer No. | Material | Thickness (nm) |
|---|---|---|
| 1 | Ag | 15.13 |
| 2 | Nb$_2$O$_5$ | 60.95 |
| 3 | Ag | 40.44 |

-continued

| Layer No. | Material | Thickness (nm) |
|---|---|---|
| 4 | Nb$_2$O$_5$ | 67.39 |
| 4 | Ag | 41.96 |
| 6 | Nb$_2$O$_5$ | 72.82 |
| 7 | Ag | 19.18 |
| 8 | Nb$_2$O$_5$ | 63.37 |

| Layer No. | Material | Thickness (nm) |
|---|---|---|
| 1 | Ag | 15.13 |
| 2 | Ta$_2$O$_5$ | 65.42 |
| 3 | Ag | 40.44 |
| 4 | Ta$_2$O$_5$ | 72.33 |
| 5 | Ag | 41.96 |
| 6 | Ta$_2$O$_5$ | 78.16 |
| 7 | Ag | 19.18 |
| 8 | Ta$_2$O$_5$ | 68.02 |

| Layer No. | Material | Thickness (nm) |
|---|---|---|
| 1 | Ag | 15.13 |
| 2 | H$_4$ | 66.94 |
| 3 | Ag | 40.44 |
| 4 | H$_4$ | 74.01 |
| 5 | Ag | 41.96 |
| 6 | H$_4$ | 79.98 |
| 7 | Ag | 19.18 |

7. The optical filter structure of claim 3, wherein the B pixel filter film is formed so that it has the structure shown in one of the following tables:

| Layer No. | Material | Thickness (nm) |
|---|---|---|
| 1 | Ti$_3$O$_5$ | 45.96 |
| 2 | Ag | 13.79 |
| 3 | Ti$_3$O$_5$ | 149.81 |
| 4 | Ag | 35.72 |
| 5 | Ti$_3$O$_5$ | 51.02 |
| 6 | Ag | 35.93 |
| 7 | Ti$_3$O$_5$ | 27.34 |

| Layer No. | Material | Thickness (nm) |
|---|---|---|
| 1 | TiO$_5$ | 46.17 |
| 2 | Ag | 13.79 |
| 3 | TiO$_5$ | 150.49 |
| 4 | Ag | 35.72 |
| 5 | TiO$_5$ | 51.25 |
| 6 | Ag | 35.93 |
| 7 | TiO$_5$ | 27.47 |

| Layer No. | Material | Thickness (nm) |
|---|---|---|
| 1 | Nb$_2$O$_5$ | 46.81 |
| 2 | Ag | 13.79 |
| 3 | Nb$_2$O$_5$ | 152.6 |
| 4 | Ag | 35.72 |
| 5 | Nb$_2$O$_5$ | 57.9 |
| 6 | Ag | 35.93 |
| 7 | Nb$_2$O$_5$ | 27.85 |

| Layer No. | Material | Thickness (nm) |
|---|---|---|
| 1 | $Ta_2O_5$ | 50.78 |
| 2 | Ag | 13.79 |
| 3 | $Ta_2O_5$ | 165.54 |
| 4 | Ag | 35.72 |
| 5 | $Ta_2O_5$ | 56.38 |
| 6 | Ag | 35.93 |
| 7 | $Ta_2O_5$ | 30.22 |

| Layer No. | Material | Thickness (nm) |
|---|---|---|
| 1 | $H_4$ | 52.15 |
| 2 | Ag | 13.79 |
| 3 | $H_4$ | 170 |
| 4 | Ag | 35.72 |
| 5 | $H_4$ | 57.9 |
| 6 | Ag | 35.93 |

8. The optical filter structure of claim 3, wherein the IR pixel filter film is formed so that it has the structure shown in one of the following tables:

| Layer No. | Material | Thickness (nm) |
|---|---|---|
| 1 | $Ti_3O_5$ | 82.56 |
| 2 | Ag | 25.75 |
| 3 | $Ti_3O_5$ | 103.95 |
| 4 | Ag | 6.08 |
| 5 | $Ti_3O_5$ | 107.6 |
| 6 | Ag | 57.09 |
| 7 | $Ti_3O_5$ | 164.38 |
| 8 | Ag | 41.11 |
| 9 | $Ti_3O_5$ | 83.61 |

| Layer No. | Material | Thickness (nm) |
|---|---|---|
| 1 | $TiO_5$ | 85.33 |
| 2 | Ag | 35.04 |
| 3 | $TiO_5$ | 84.7 |
| 4 | Ag | 1.83 |
| 5 | $TiO_5$ | 91.42 |
| 6 | Ag | 64.05 |
| 7 | $TiO_5$ | 161.88 |

-continued

| Layer No. | Material | Thickness (nm) |
|---|---|---|
| 8 | Ag | 42.43 |
| 9 | $TiO_5$ | 78.35 |

| Layer No. | Material | Thickness (nm) |
|---|---|---|
| 1 | $Nb_2O_5$ | 86.45 |
| 2 | Ag | 35.04 |
| 3 | $Nb_2O_5$ | 85.82 |
| 4 | Ag | 1.83 |
| 5 | $Nb_2O_5$ | 92.63 |
| 6 | Ag | 64.05 |
| 7 | $Nb_2O_5$ | 164.01 |
| 8 | Ag | 42.43 |
| 9 | $Nb_2O_5$ | 79.39 |

| Layer No. | Material | Thickness (nm) |
|---|---|---|
| 1 | $Ta_2O_5$ | 94.32 |
| 2 | AC | 35.04 |
| 2 | $Ta_2O_5$ | 93.63 |
| 4 | Ag | 1.83 |
| 5 | $Ta_2O_5$ | 101.05 |
| 6 | Ag | 64.05 |
| 7 | $Ta_2O_5$ | 178.94 |
| 8 | Ag | 42.43 |
| 9 | $Ta_2O_5$ | 86.61 |

| Layer No. | Material | Thickness (nm) |
|---|---|---|
| 1 | $H_4$ | 94.32 |
| 2 | Ag | 35.04 |
| 3 | $H_4$ | 93.63 |
| 4 | Ag | 1.83 |
| 5 | $H_4$ | 101.05 |
| 6 | Ag | 64.05 |
| 7 | $H_4$ | 178.94 |
| 8 | Ag | 42.43 |
| 9 | $H_4$ | 86.61 |

* * * * *